US012689469B2

(12) United States Patent
Järvenpää et al.

(10) Patent No.: US 12,689,469 B2
(45) Date of Patent: Jul. 21, 2026

(54) COMPUTING A POLAR TRANSFORMATION

(71) Applicant: Nordic Semiconductor ASA, Trondheim (NO)

(72) Inventors: Matias Järvenpää, Oulu (FI); Petri Väisänen, Oulu (FI)

(73) Assignee: Nordic Semiconductor ASA, Trondheim (NO)

( * ) Notice: Subject to any disclaimer, the term of this patent is extended or adjusted under 35 U.S.C. 154(b) by 105 days.

(21) Appl. No.: 18/917,805

(22) Filed: Oct. 16, 2024

(65) Prior Publication Data

US 2025/0132863 A1 Apr. 24, 2025

(30) Foreign Application Priority Data

Oct. 24, 2023 (GB) ...................................... 2316260

(51) Int. Cl.
H04L 1/00 (2006.01)
H03M 13/00 (2006.01)
(Continued)

(52) U.S. Cl.
CPC .......... H04L 1/0071 (2013.01); H03M 13/13 (2013.01); H03M 13/27 (2013.01);
(Continued)

(58) Field of Classification Search
CPC ... H04L 1/0071; H04L 1/0041; H04L 1/0057; H04L 1/0061; G06F 7/768; G06F 7/57;
(Continued)

(56) References Cited

U.S. PATENT DOCUMENTS 11,184,111 B1 11/2021 Shah
2018/0097580 A1* 4/2018 Zhang ................... H04L 1/0041
(Continued)

FOREIGN PATENT DOCUMENTS

CN 115811318 B 5/2023

OTHER PUBLICATIONS

H. Mahdavifar, M. El-Khamy, J. Lee and I. Kang, "Polar Coding for Bit-Interleaved Coded Modulation," in IEEE Transactions on Vehicular Technology, vol. 65, No. 5, pp. 3115-3127, May 2016 (Year: 2016).*

(Continued)

*Primary Examiner* — Cynthia Britt
(74) *Attorney, Agent, or Firm* — Klarquist Sparkman, LLP

(57) ABSTRACT

A radio apparatus is configured to implement a method for computing a polar transformation of an input bit sequence of $2^n$ bits for transmission by radio. The method comprises storing the input bit sequence in electronic memory as a working bit sequence, and then computing a bitwise XOR of a contiguous first half of the working bit sequence with a contiguous second half of the working bit sequence, the second half being disjoint from the first half. The result of the bitwise XOR is stored in electronic memory. A bit-interleave sequence is generated by interleaving the result of the bitwise XOR with the second half of the working bit sequence. Next, the bit interleave sequence is stored as the updated working bit sequence. After n iterations of the previous steps are performed, the working bit sequence, or a contiguous subsequence thereof, is the polar transformation of the input sequence.

20 Claims, 4 Drawing Sheets

(51) Int. Cl.
| | |
|---|---|
| *H03M 13/13* | (2006.01) |
| *H03M 13/27* | (2006.01) |
| *H03M 13/29* | (2006.01) |

(52) U.S. Cl.
CPC ..... *H03M 13/2906* (2013.01); *H03M 13/611* (2013.01); *H04L 1/0041* (2013.01); *H04L 1/0057* (2013.01)

(58) Field of Classification Search
CPC ......... H03M 13/6502; H03M 13/2906; H03M 13/13; H03M 13/27; H03M 13/611
See application file for complete search history.

(56) References Cited

U.S. PATENT DOCUMENTS

| | | | | |
|---|---|---|---|---|
| 2020/0403728 A1* | 12/2020 | Chen | ..................... | H04L 1/0061 |
| 2022/0123767 A1* | 4/2022 | Bioglio | ................. | H03M 13/13 |
| 2024/0022264 A1* | 1/2024 | Iqbal | ..................... | H04W 28/04 |

OTHER PUBLICATIONS

3GPP TS 38.212 V17.5.0, Release 17, Section 5.3.1 "Polar coding," Mar. 2023, pp. 13-19.

Arikan, "Polar codes: A pipelined implementation," *4th International Symposium on Broadband Communication*, Jul. 2010, 3 pages.

Guo et al., "Parallel Polar Encoding in 5G Communication," *IEEE Symposium on Computers and Communications*, Jun. 2018, pp. 64-69.

IPO Combined Search and Examination Report under Sections 17 and 18(3), dated Mar. 22, 2024, 8 pages.

Iqbal et al., "Hardware Architecture of Channel Encoding for 5G New Radio Physical Downlink Control Channel," *Proceedings of IEEE International Conference on Communications*, Jun. 2023, pp. 2258-2263.

Stone, "Parallel Processing with the Perfect Shuffle," *IEEE Transactions on Computers*, vol. C-20, No. 2, Feb. 1971, pp. 153-161.

* cited by examiner

100

101    102

CPU    DSP

Memory    Radio
Circuitry

105

103    104

COMPUTING A POLAR TRANSFORMATION

CROSS REFERENCE TO RELATED APPLICATION

This application claims priority from Great Britain Application No. 2316260.5, filed Oct. 24, 2023, which application is incorporated herein by reference in its entirety.

TECHNICAL FIELD

This invention relates to methods and apparatus for computing a polar transforming of a sequence of $2^n$ bits.

BACKGROUND

Methods for computing the polar transformation of a sequence of bits have seen increased interest in recent years, due at least in part to the adoption of polar coding in the standardisation of 5G NR (New Radio) cellular systems by the $3^{rd}$ Generation Partnership Project (3GPP). Polar encoding is specified as a coding scheme for the control channel in the 5G communication standard. Radio devices operating under 5G NR are therefore required to be able to perform such a polar encoding of a sequence of bits for up-link transmission.

One approach to computing the polar transformation of a binary sequence is to use a CPU (central processing unit) or DSP (digital signal processor) to perform a matrix multiplication operation to compute a vector-matrix product that defines the polar transformation. However, this can be slow and can require significant processing and memory resources.

Another approach is to compute the polar transformation of a sequence of $2^n$ bits using dedicated digital hardware logic. This can be done by providing a network of binary XOR gates arranged in n stages, each containing $2^{n-1}$ XOR gates. However, such an approach requires a very large number of logic gates for typical values of n, such as n=10.

Embodiments of the present invention seek to provide a more efficient way to compute a polar transformation.

SUMMARY OF THE INVENTION

From a first aspect, the invention provides an electronic apparatus comprising an electronic memory, wherein the electronic apparatus is configured to implement a method for computing a polar transformation of an input sequence of $2^n$ bits, the method comprising:

storing the input sequence of $2^n$ bits, optionally interleaved with an integer multiple of $2^n$ additional bits, as a working bit sequence in the electronic memory; and performing the following sequence of steps n times:

i) computing a bitwise XOR of a contiguous first half of the working bit sequence with a contiguous second half of the working bit sequence, wherein the second half is disjoint from the first half;

ii) storing a result of the bitwise XOR in the electronic memory;

iii) generating a bit-interleave sequence by interleaving the result of the bitwise XOR and the second half of the working bit sequence as alternate bits of the bit-interleave sequence; and iv) updating the working bit sequence by storing the bit-interleave sequence in the electronic memory as an updated working bit sequence;

wherein, after performing the steps n times, the working bit sequence, or a contiguous subsequence thereof, is the polar transformation of the input sequence.

From a second aspect, the invention provides a method for computing a polar transformation of an input sequence of $2^n$ bits, performed by an electronic apparatus, the method comprising:

storing the input sequence of $2^n$ bits, optionally interleaved with an integer multiple of $2^n$ additional bits, as a working bit sequence in an electronic memory of the electronic apparatus; and performing the following sequence of steps n times:

i) computing a bitwise XOR of a contiguous first half of the working bit sequence with a contiguous second half of the working bit sequence, wherein the second half is disjoint from the first half;

ii) storing a result of the bitwise XOR in the electronic memory;

iii) generating a bit-interleave sequence by interleaving the result of the bitwise XOR and the second half of the working bit sequence as alternate bits of the bit-interleave sequence; and iv) updating the working bit sequence by storing the bit-interleave sequence in the electronic memory as the working bit sequence;

wherein, after performing the steps n times, the working bit sequence, or a contiguous subsequence thereof, is the polar transformation of the input sequence.

From a third aspect, the invention provides software (and a non-transitory computer-readable storage medium bearing the same) comprising instructions that, when executed by one or more processors of an electronic apparatus comprising an electronic memory, cause the electronic apparatus to perform a method for computing a polar transformation of an input sequence of $2^n$ bits as disclosed herein.

Thus it will be seen that, in accordance with embodiments of the invention, the polar transformation of a sequence of $2^n$ bits can be efficiently calculated by performing n iterations of a bitwise XOR operation and a bit-interleave operation. In this way, a particularly efficient implementation of the polar transformation of a sequence of bits is possible. In particular, the method is well suited to efficient implementation in software, or in hardware, or in a combination of software and hardware, as explained in more detail below.

The methods described herein can be applied in any scenario where is it required to compute a polar transformation of a series of bits. However, in some embodiments, the input sequence is data for transmission by radio, e.g. in a 5G NR transmission.

The repeated use of an alternating bit-interleave operation enables particularly efficient implementation when the interleaving is performed by hardware (i.e. by electronic circuitry), since a same circuit portion can perform each of the n interleaving operations. In some embodiments, a circuit portion may perform each of the n bitwise XOR operations. This approach may advantageously allow for less hardware to be used (i.e. fewer logic gates) compared with, for example, providing a network of $2^{n-1} \times n$ binary XOR gates. The hardware may thus occupy less area in embodiments in which the electronic apparatus is integrated on an integrated-circuit device.

In embodiments where the method is executed using software, the method may advantageously allow for a more straightforward implementation (e.g. simpler coding) and/or more efficient use of processing and/or memory resources compared with, for example, performing a vector-matrix multiplication in software.

In a set of embodiments, the method may be implemented using hardware circuitry alone—i.e. not requiring any programmable processor. (Software may however be used to invoke and/or configure the hardware logic, e.g. by providing the input sequence as input and/or receiving the polar transformation as output.) The electronic apparatus may comprise an XOR module, comprising one or more binary XOR gates, for computing the bitwise XOR. It may comprise a hardware bit-interleave module, not containing any programmable processor, for generating the bit-interleave sequence. Implementing the method in this way may advantageously allow for reduced load on any CPU of an apparatus on which the method is performed.

In some embodiments, the electronic apparatus may comprise a first register and a second register. Each register may be a processor or DSP register, or may be an addressable or non-addressable hardware register—e.g. comprising a set of flip-flops. Each register may be implemented as a single block of flip-flops, but this is not essential. The first register may be arranged to store the working bit sequence and to store each updated working bit sequence. Each updated working bit sequence may overwrite a preceding working bit sequence. The second register may be used to store at least the result of the bitwise XOR. Each register may be of length $2^k$ bits, where k n. Each register may have a same length as the working bit sequence. In some embodiments, each register is of exactly length $2^n$ bits, e.g. of length 512, 1024 or 2048 bits. However, having the registers be of length greater than $2^n$ bits (e.g. $2^{(n+1)}$ or $2^{(n+2)}$) may allow the apparatus to process the input sequence interleaved with one or more further input sequences, e.g. for computing two or more polar transformations in parallel, and/or to compute polar transformations of input sequences of different lengths at different times. When the registers are longer than the input sequence and it is not desired to compute two or more polar transformations in parallel, the input sequence may be interleaved with all zero bits, as described in more detail below.

In some embodiments, the electronic apparatus may comprise a digital signal processor (DSP). The method may comprise computing the bitwise XOR of the contiguous first half of the working bit sequence with the contiguous second half of the working bit sequence using instructions executed on the DSP—e.g. using one or more native SIMD (Single Instruction, Multiple Data) instructions. The working bit sequence may be stored in one or more (e.g. across two) registers of the DSP. In some such embodiments, the method may comprise generating the bit-interleave sequence using hardware circuitry (e.g. a bit-interleave module), which may be provided as a custom hardware extension to the DSP. However, in other embodiments, the method may comprise computing both the bitwise XOR and the bit-interleave sequence using native SIMD instructions of a DSP.

In some embodiments, the method may be implemented by software instructions executed on a scalar or superscalar processor (e.g. a general-purpose CPU). This arrangement may advantageously require fewer specialised components (e.g. dedicated hardware modules) to be used when implementing the method. This may be beneficial when implementing the method on existing hardware.

In some embodiments the working bit sequence is exactly the input sequence of $2^n$ bits. However, in a set of embodiments, the input sequence may be stored interleaved with an integer multiple of $2^n$ additional bits (e.g. with $2^n$ additional bits, or $2 \times 2^n$, or $3 \times 2^n$ or $4 \times 2^n$, etc. additional bits), before the sequence of steps is performed n times. This allows for the method and apparatus to compute the polar transformation of an input sequence that is less than the total length of a register or one or more processor registers used to store the working bit sequence. In this way, the same hardware and/or software can be efficiently used for computing polar transformations of input sequences of different lengths. The additional bits may be all zero bits, or they may comprise one or more further input sequences each of $2^n$ bits, or they may comprise one or more further input sequences each of $2^n$ (i.e. not all zero bits) and one or more sequences of $2^n$ zero bits.

In embodiments in which the electronic apparatus comprises a hardware bit-interleave module for generating each of the bit-interleave sequences by interleaving the result of the bitwise XOR and the second half of the working bit sequence, the electronic apparatus may be further configured to use the hardware bit-interleave module to interleave the input sequence with an integer multiple of $2^n$ additional bits, and to store the resulting interleaved sequence as the working bit sequence in the electronic memory, before the sequence of steps is performed n times. This may be more efficient than performing the initial interleaving in software. The electronic apparatus may be configured initially to store the input sequence to the electronic memory as a contiguous subsequence of the working bit sequence (e.g. in the first register), with the additional bits stored contiguously in the working bit sequence, and then to apply an initial interleaving process to the working bit sequence. This may comprise using the bit-interleave module one or more times to interleave the input sequence with the additional bits, and storing the resulting interleaved sequence to the electronic memory as the interleaved working bit sequence. The sequence of steps may then be applied n times to this working bit sequence. The electronic apparatus may be configured to perform the initial interleaving process without computing bitwise XORs of the working bit sequence. This may ensure the polar transformation of the input sequence is computed correctly when the additional bits comprise one or more further input sequences. It may improve efficiency when the additional bits are zero bits, by avoiding unnecessary XOR operations, especially when the method performs the bitwise XOR in software (e.g. on a DSP).

In a set of embodiments, the input sequence may be interleaved with one or more further input sequences each of $2^n$ bits. The method may compute the respective polar transformations of each of the input sequences in parallel (i.e. at the same time). In embodiments in which the electronic apparatus comprises a hardware bit-interleave module, the electronic apparatus may be configured initially to store each input sequence contiguously as the working bit sequence (e.g. in the first register) and then apply the bit-interleave module to the working bit sequence one or more times to interleave the input sequences. It may store the resulting interleaved input sequences as the working bit sequence (e.g. in the first register). The sequence of steps may then be performed n times.

In a set of embodiments, the electronic apparatus is a radio device. The input sequence may be data for transmission in radio message. The electrical apparatus may comprise radio transmitter circuitry and be configured to transmit the polar transformation of the input sequence by radio.

The electronic apparatus may be a self-contained device, or it may be a component for inclusion within a larger device. It may be a system-on-chip.

In a set of embodiments, the electronic apparatus is further configured to provide the computed polar transformation as input to one or more other components within or external to the electronic apparatus. For example, the polar transformation of the input sequence may be provided to a transmitter apparatus. It may be provided to other processing apparatus. It may be provided to a shared memory.

The value of n may be any number greater than zero, e.g. greater than one, two or three. In some examples, the value of $2^n$ is 512 or 1024 or 2048, with n being 9, 10 or 11 respectively. Having n less than or equal to 11 may advantageously allow the method and apparatus to support 5G NR radio transmission.

The electronic apparatus may comprise a processing system, e.g. comprising a programmable processor and/or non-programmable processing circuitry, as well as an electronic memory. The processing system may comprise an XOR module and/or a hardware bit-interleave module, as disclosed herein. Alternatively or additionally the processing system may comprise a processor (e.g. DSP or CPU) for executing instructions stored in the electronic memory.

The electronic apparatus may comprise a memory storing software, e.g. software as disclosed herein, for execution by a CPU and/or DSP of the electronic apparatus. Features of any aspect or embodiment described herein may, wherever appropriate, be applied to any other aspect or embodiment described herein. Where reference is made to different embodiments or sets of embodiments, it should be understood that these are not necessarily distinct but may overlap.

BRIEF DESCRIPTION OF THE DRAWINGS

Certain embodiments of the invention will now be described, by way of example only, with reference to the accompanying drawings, in which.

DETAILED DESCRIPTION OF EMBODIMENTS

Figure 1:
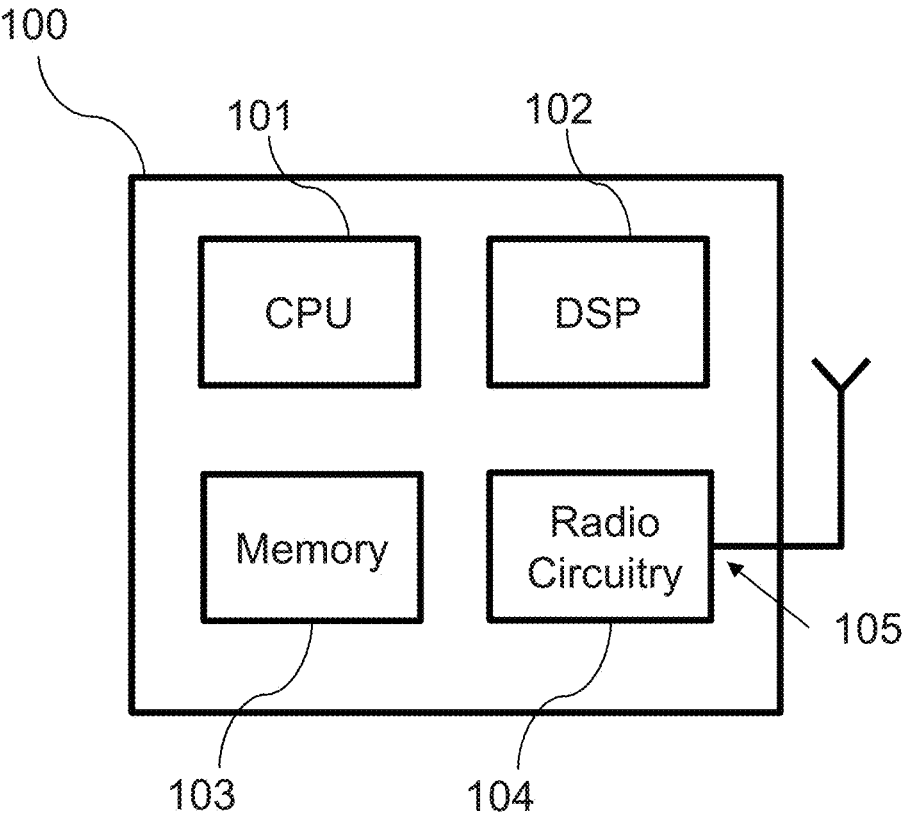
FIG. 1 is a schematic diagram of an 5G NR capable radio device embodying the invention.

FIG. 1 shows a radio device 100 comprising a CPU 101, a digital signal processor (DSP) 102, an electronic memory 103, and radio circuitry 104. The CPU 101, DSP 102 and memory 103 together form a processing system.

The radio circuitry 104 includes radio transmitter circuitry and radio receiver circuitry. It may include analog circuitry and digital logic, and may comprise components such as oscillators, filters, amplifiers, digital to analogue converters (DACs), and analogue to digital converters (ADCs). The radio circuitry has an interface 105 for connection to an antenna, which may be a part of the radio device 100 or may be separate from the radio device 100. The radio device 100 may be a complex device, such as a vehicle, a smartphone, a domestic appliance, etc., that has radio communication capabilities, or it may be a component for use in a larger device. In some examples, the radio device 100 is a system-on-chip (SoC). The radio device 100 may include a power supply, or may be arranged to be coupled to one or more external components such as an external power supply.

In some examples, the radio device 100 is configured for communication according to the 5G New Radio (NR) specification. In particular, the radio device 100 is configured to perform polar encoding of data for 5G up-link transmission as set out in the 3GPP TS 38.212 standard.

According to the 3GPP standard, 5G communication requires compatible devices to perform a polar transformation of a sequence of bits which is to be transmitted.

The radio device 100 is efficiently configured for performing polar transformations, as described in detail below. However, before describing how the radio device 100 operates, it is helpful to consider two naïve approaches to computing a polar transformation of a sequence of $2^n$ bits.

A first naïve way to implement the transformation for a sequence of $N=2^n$ bits is to perform a vector-matrix multiplication operation on a vector of the input bits and a generator matrix $G_N$ in software, executing on a CPU or on a DSP. The generator matrix $G_N$ is the $n^{th}$ Kronecker product of the generator matrix $G_2$, where $G_2$ is given as $$G_2 = \begin{bmatrix} 1 & 0 \\ 1 & 1 \end{bmatrix}.$$

However, in performing this matrix operations, significant processing and memory resources are expended when n is in the range required by 5G. A naïve multiplication by the generator matrix is of $O(N^2)$ complexity and requires at least $N(N+1)/2$ bits of memory for the generator matrix. This presents a significant challenge to those who wish to incorporate 5G into devices with limited compute resources.

Figure 2:
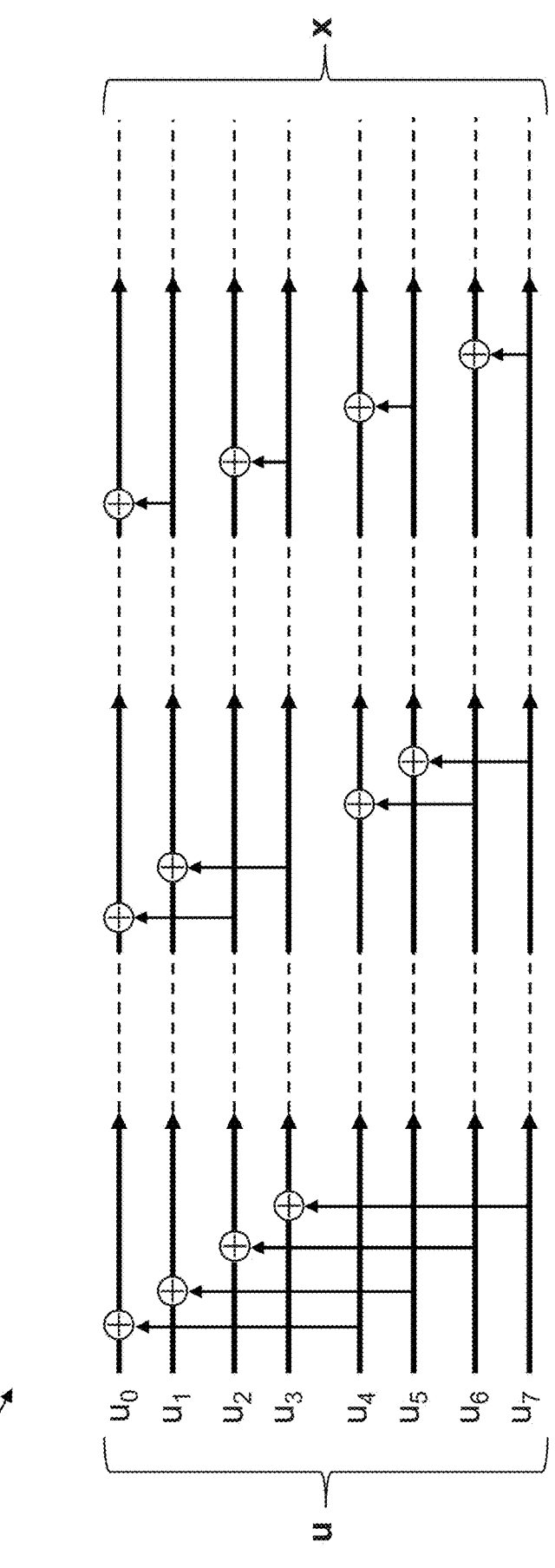
FIG. 2 is a schematic diagram showing a naïve hardware implementation of a polar transformation.

A second naïve approach is to implement the polar transformation using a network of binary XOR gates arranged in n stages, each containing $2^{n-1}$ XOR gates, as shown in FIG. 2 for n=3. The hardware logic may be arranged within an encoder in the radio circuitry of a radio device. Using dedicated hardware logic can be more efficient than a naïve software implementation. However, when considering the implementation of FIG. 2, it will be seen that certain difficulties arise.

FIG. 2 shows a specific example for the case of N=8 bits, with n therefore being equal to 3. However, as will be appreciated, this approach can be scaled for any number $2^n$ of bits by introducing more lines and XOR gates and additional stages.

Each row of the diagram 200 in FIG. 2 represents the path of a single bit $u_m$ within the total input bit array u, with $u_0$ at the top and $u_7$ at the bottom. Since there are a total of eight bits, three different stages are required to achieve the desired polar transformed output array x, with individual bits $x_m$.

The input bits u undergo a sequence of n unique XOR operation stages. The first stage of FIG. 2 computes $u_0 \oplus u_4$, $u_1 \oplus u_5$, $u_2 \oplus u_6$, and $u_3 \oplus u_7$, generalising to $u_m \oplus u_{m+4}$. However, moving on to the second stage, it can be seen that the XOR operations occur in general between $u_m \oplus u_{m+2}$ bits. Finally, referring to the third stage, it can be seen that the XOR operations are in general between $u_m \oplus u_{m+1}$ bits. The method of FIG. 2 generalises for a sequence of $N=2^n$ bits, requiring the computation of n stages of $u_m \oplus u_{m+p}$, where $p=N/2^k$ for integer k between $1 \leq k \leq n$.

Notably, every stage of the transformation requires its own unique arrangement of bitwise XOR logic gates to successfully implement the transformation, with a large number of XOR gates and connections being required as n increases.

Embodiments disclosed herein use a better approach that can be implemented more easily and efficiently. In particular, by incorporating a bit-interleaving stage between each XOR step in the transformation, the need to use n different XOR operation stages can be eliminated, and a same bitwise XOR operation can be repeated for n iterations of the transformation.

Different embodiments of the exemplary radio device 100 may implement this approach fully in hardware circuitry, or fully in software, or using a combination of hardware and software.

An example hardware-based embodiment will be discussed with reference to FIG. 3, which shows in schematic form hardware logic 300 (i.e. circuitry) that may be contained within the radio circuitry 104 of the radio device 100 (e.g. within an encoder module).

The hardware logic 300 contains a first memory register 301, a second memory register 303, an XOR module 302, a bit-interleave module 304 and connecting lines for performing an iterative process for calculating the polar transformation of an input sequence. In some examples, the first memory register 301 is addressable (e.g. memory-mapped).

The hardware logic 300 can receive $N=2^n$ input bits to the polar transformation, with frozen bits already inserted.

In a preferred embodiment, the first memory register 301 is of length $2^k$, where $k \geq n$. In some examples $k=10$. The input sequence of $2^n$ bits to be transformed is stored in the first memory register 301, interleaved with $2^n-2^k$ additional bits, as the $2^k$-bit starting vector u. The additional bits may be all zero bits, or may be one or more additional input sequences each of length $2^n$ bits, or may be one or more additional input sequences each of length $2^n$ bits in combination with one or more sequences of $2^n$ zero bits. Such interleaving, where required, may be performed by the hardware logic 300 itself as described in more detail below, or by other hardware or software.

The $2^k$ bit sequence stored in the first register 301 is formed of a contiguous first half subsequence A and a contiguous second half subsequence B, which is non-overlapping with A. The first half A is stored in a first half 301a of the first register 301, and the second half B is stored in a second half 301b of the first memory register 301. The bit sequence that is stored within the first memory register 301 at any moment in time as referred to herein as the "working bit sequence". Initially it has the value u but its value will be updated over time, as explained below.

The hardware logic 300 is configured to perform at least n iterations, each of which results in an updated value being stored into the first register 301, after which the first register 301 will contain the polar transformation of the input sequence.

At each iteration, connecting lines allow for the subsequences A and B to be passed to the XOR module 302 as part of a first step in the iterative polar transformation process can be computed. The XOR module 302 performs a bitwise XOR operation between the constituent bits of A and B. The XOR module 302 may contain a single binary XOR gate and process pairs of bits serially, but, in some examples, it contains k/2 XOR gates and processes the bit pairs in parallel.

If $0 \leq m \leq M$ indexes the bits within the starting vector u stored initially in the first memory register 301, with $M=2^k$, then at the first iteration of the transformation, the XOR module 302 performs M/2 instances of the operation $u_m \oplus u_{m+M/2}$.

The resulting sequence of bits is passed to a second memory register 303, which is also partitioned into a first half 303a and a second half 303b. The second memory register 303 is also of length $M=2^k$ bits, equal to the length of the first memory register 301. The output from the XOR logic 302 is stored in the first half 303a of the second memory register 303. The bits B are passed via lines directly from the second half 301b of the first register 301 to the second half 303b of the second register 303, such that the following operation is performed:

$$[A,B] \Rightarrow [A \oplus B, B].$$

Once the transfer is complete, the contents of the second memory register 303 are then transferred to a bit-interleave module 304 which performs a bit-interleave operation. The bit-interleave operation interleaves the M/2 bits of the first half register 303a (i.e. the output of the XOR module 302), in bitwise alternating fashion, with the M/2 bits of the second half register 303b. The M-bit output from the bit-interleave module 304 is stored into the first memory register 301 as an updated working bit sequence, thereby completing one round of the iterative process.

This process is performed n times in order to fully complete the polar transformation. Due the action of the bit-interleave module 304, at the second iteration the XOR module 302 performs M/2 instances of the binary XOR operation $u_m \oplus u_{m+M/4}$ on different pairs of bits. This is equivalent to the second stage shown in FIG. 2. Then, at the third iteration, it performs M/2 instances of the operation $u_m \oplus u_{m+M/4}$ on different pairs of bits, equivalent to the third stage shown in FIG. 2, and so on.

The resulting value can be read out of the first register 301 by software or hardware for further processing and/or transmission in a radio packet.

The following table provides an example of values calculated at each stage by the XOR module 302 and bit-interleave module 303 in an example embodiment in which $k=4$. The first column "i" denotes the index for each bit within the working bit sequence, the "XOR" columns denote the output of the XOR operation for each stage, and the "PERM" columns denote the output of the bit-interleave operation for each stage. The "uX" and "vX" entries in the table represent the actual bits in the working bit sequence for each respective input.

In the specific case shown, there are two 4-bit inputs in a 16-bit working bit sequence. The final polar transformed bit sequences are given in the final column. Since each input is also half padded with zeros, the XOR operation can be skipped in stage 1, as will be discussed in more detail later.

| | | STAGE: 1 | STAGE: 2 | | STAGE: 3 | | STAGE: 4 | |
|---|---|---|---|---|---|---|---|---|
| i | Input | PERM | XOR | PERM | XOR | PERM | XOR | PERM |
| 0 | u0 | u0 | u0 + 0 | u0 + 0 | u0 + 0 + u2 + 0 | u0 + 0 + u2 + 0 | u0 + 0 + u2 + 0 + u1 + 0 + u3 + 0 | u0 + 0 + u2 + 0 + u1 + 0 + u3 + 0 |
| 1 | u1 | v0 | v0 + 0 | 0 | 0 + 0 | u2 + 0 | u2 + 0 + u3 + 0 | u1 + 0 + u3 + 0 |
| 2 | u2 | u1 | u1 + 0 | v0 + 0 | v0 + 0 + v2 + 0 | 0 + 0 | 0 + 0 + 0 + 0 | u2 + 0 + u3 + 0 |

-continued

| | | STAGE: 1 | STAGE: 2 | | STAGE: 3 | | STAGE: 4 | |
|---|---|---|---|---|---|---|---|---|
| i | Input | PERM | XOR | PERM | XOR | PERM | XOR | PERM |
| 3 | u3 | u3 | v1 | v1 + 0 | 0 | 0 + 0 | 0 | 0 + 0 | u3 + 0 |
| 4 | 0 | 0 | u2 | u2 + 0 | u1 + 0 | u1 + 0 + u3 + 0 | v0 + 0 + v2 + 0 | v0 + 0 + v2 + 0 + v1 + 0 + v3 + 0 | 0 + 0 + 0 + 0 |
| 5 | 0 | 0 | v2 | v2 + 0 | 0 | 0 + 0 | v2 + 0 | v2 + 0 + v3 + 0 | 0 + 0 |
| 6 | 0 | 0 | u3 | u3 + 0 | v1 + 0 | v1 + 0 + v3 + 0 | 0 + 0 | 0 + 0 + 0 + 0 | 0 + 0 |
| 7 | 0 | 0 | v3 | v3 + 0 | 0 | 0 + 0 | 0 | 0 + 0 | 0 |
| 8 | v0 | v0 | 0 | 0 | u2 + 0 | u2 + 0 | u1 + 0 + u3 + 0 | u1 + 0 + u3 + 0 | v0 + 0 + v2 + 0 + v1 + 0 + v3 + 0 |
| 9 | v1 | v1 | 0 | 0 | 0 | 0 | u3 + 0 | u3 + 0 | v1 + 0 + v3 + 0 |
| 10 | v2 | v2 | 0 | 0 | v2 + 0 | v2 + 0 | 0 + 0 | 0 + 0 | v2 + 0 + v3 + 0 |
| 11 | v3 | v3 | 0 | 0 | 0 | 0 | 0 | 0 | v3 + 0 |
| 12 | 0 | 0 | 0 | 0 | u3 + 0 | u3 + 0 | v1 + 0 + v3 + 0 | v1 + 0 + v3 + 0 | 0 + 0 + 0 + 0 |
| 13 | 0 | 0 | 0 | 0 | 0 | 0 | v3 + 0 | v3 + 0 | 0 + 0 |
| 14 | 0 | 0 | 0 | 0 | v3 + 0 | v3 + 0 | 0 + 0 | 0 + 0 | 0 + 0 |
| 15 | 0 | 0 | 0 | 0 | 0 | 0 | 0 | 0 | 0 |

The following paragraphs provide a mathematical justification to explain how performing an alternating bit-interleave operation after the XOR module 302 does indeed result in the polar transformation of the input sequence being stored in the first register 301.

The case where n=k will be considered first—i.e. where the input sequence fully occupies the first register 301—since this is the simplest to follow. The processing of shorter input sequences is then considered further below.

Originally, the data from A and B is ordered such that, at index position m of the first hardware register 301, expressed with k bits, there is data from index position m of the starting vector u. This may be written as the following:

$$d[m]=m.$$

When the bitwise XOR module 302 is applied, each individual XOR takes an input from bits at position m and m+M/2 of the first hardware register 301.

Considering the identity above, the original data at position m+M/2 will be:

$$d[m + M/2] = m + M/2$$

and therefore, $$d[m + M/2] - d[m] = M/2$$

in the cases where m<M/2.

Now consider the binary representation of the values d[m]=m and d[m+M/2]=m+M/2. Since m<M/2, the bit that represents value $M/2=2^{k-1}$ is 0 in d[m]. Since d[m+M/2]=d[m]+M/2, this guarantees that the same bit is 1 in d[m+M/2]. Therefore d[m] and d[m+M/2] differ only by this one bit, which also happens to be the most significant bit (MSB) in their binary representations.

Now consider the effect of the bit-interleave permutation performed by the bit-interleave module 304. For the series of bits considered in this process, bit-interleaving is analogous to performing a cyclical right shift of the binary representation of index of the bit stored at position d[m] to get the index of the bit stored at position for d[m] after the interleaving. This is because cyclical right shift corresponds, for even index values, m, to a division by two (i.e. m/2), and, for odd index values, to calculating (m−1)/2+M/2, due to a wrapping around of the least significant bit to become the most significant bit. Therefore, since it is known that d[m] and d[m+M/2] only differ by one bit, this will remain true after one cyclical right shift, but the bit position where they differ is shifted one position to the right. As a result, d[m+M/2]−d[m] is halved, which means that each bitwise XOR operation will have its inputs from data positions m and m+N/4, as desired for calculating a polar transformation. This is repeated, and on every repetition the difference d[m+M/2]−d[m] is halved, until n iterations have been performed and the values wrap around back to the originals.

When comparing this with the naïve hardware implementation of FIG. 2, it can be seen that the hardware logic 300 performs the same mathematical operations to perform the full polar transformation on an input sequence of $2^k$ bits. However, in contrast to FIG. 2, it does so by repeated application of the same XOR module 302 and bit-interleave module 304, thereby enabling a much more compact and efficient implementation, requiring only 2×M bits of memory.

Thus the hardware logic 300 can efficiently calculate the polar transformation of an input sequence of length $2^k$ bits (i.e. with n=k), where the input sequence completely fills the first register 301. However, the same implementation can also be used to calculate the polar transformation of a shorter input sequence of $2^n$ bits, where n<k.

This can be accomplished by initially interleaving the $2^n$ input bits with $2^k - 2^n$ zero bits in the first register 301, with the $2^n$ input bits spaced at regular intervals (e.g. every second, third or fourth bit), and then performing the n iterations as described above. After this, the first $2^n$ bits of the first register 301 will contain the polar transformation of the $2^n$ input sequence. The initial interleaving may advantageously be performed using the very same hardware logic 300. This can be done by initially storing the $2^n$ input bits contiguously at a first end of the first register 301, in the first half 301a, with the rest of the register 301 filled with zeros. Performing k-n iterations of the XOR module 302 and bit-interleave module 304 will result in the required interleaving being stored into the first register 301, ready for performing the n iterations required to generate the polar transformation.

This hardware logic 300 thus provides a versatile solution for efficiently supporting a range of 5G polar code lengths. This advantageously means that the radio device 100 does not need to have any costly duplicate hardware for different lengths of input sequence.

By way of example, in the case of N=4 bits, the four bits can be loaded as the first four bits of the first register 301, with the rest of the bits set to zero. Relying on the identity that $u_m \oplus 0 = u_m$, it can be seen that a first pass through the XOR logic 302 will not alter the bits. The process of FIG. 3 can thus be continued for k iterations, and the resulting sequence of bits will be the desired 4-bit polar transformation. The first k–4 iterations will simply rearrange the input bits until they are uniformly spaced across the first register 301, and the final four iterations will perform substantive XOR operations to calculate the polar transformation.

More generally, for a polar code of length $2^n$ where n<k, when using zero-padding, the interleave process is preferably performed a total of k times to return the bits back to their original order. However, it is not necessary to perform the XOR operations using the XOR logic 302 when the iteration number of the transformation executed in FIG. 3 is less than n–k. This is due to the fact that, at such stages in the transformation, the XOR operations are performed with zeros. However, the bit-interleave operation performed with the bit-interleave module 304 must still be performed k times. Therefore, in some embodiments, there may be additional logic which checks if the iteration count is less than n–k, and bypasses the bitwise XOR module 302 when it is. This bypassing may be particularly beneficial when implementing the bitwise XOR operations in software, as in some variant embodiments described below.

Figure 3:
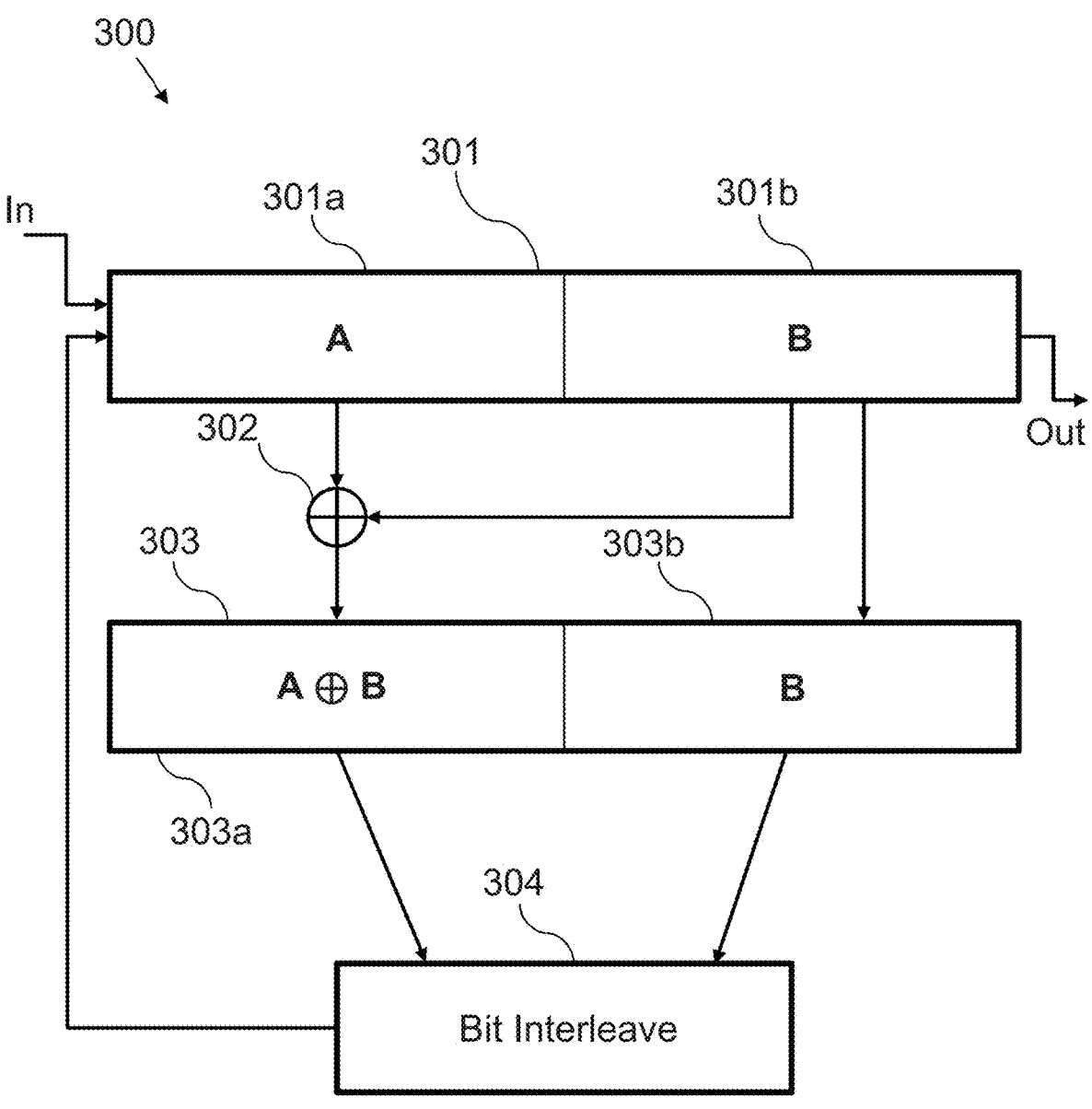
FIG. 3 is a schematic diagram of hardware logic embodying the invention.

It is also possible to use the hardware logic 300 of FIG. 3 to simultaneously compute the polar transformations of $2^{k-n}$ inputs sequences each of length $2^n$, where n≤k.

If, as in some embodiments, the hardware logic 300 has additional logic for disabling the XOR module 302 for an initial number of iterations, the multiple input sequences can be stored sequentially to the first register 301. The hardware logic 300 can then perform k–n iterations with the XOR module 302 disabled, but with the bit-interleave module 304 active. This has the effect of uniformly interleaving the two or more input sequences in the first register 301. If the XOR module 302 cannot be disabled, then the input sequences may be pre-interleaved by software or other hardware and stored into the first register 301 from outside the hardware logic 300.

A further n iterations can then be performed with the XOR module 302 enabled, which will cause the hardware logic 300 to calculate the required $2^{k-n}$ polar transformations and store them sequentially in the first register 301.

In other embodiments, some or all of the iterative process described above may be performed by software executing on a CPU or DSP.

Figure 4:
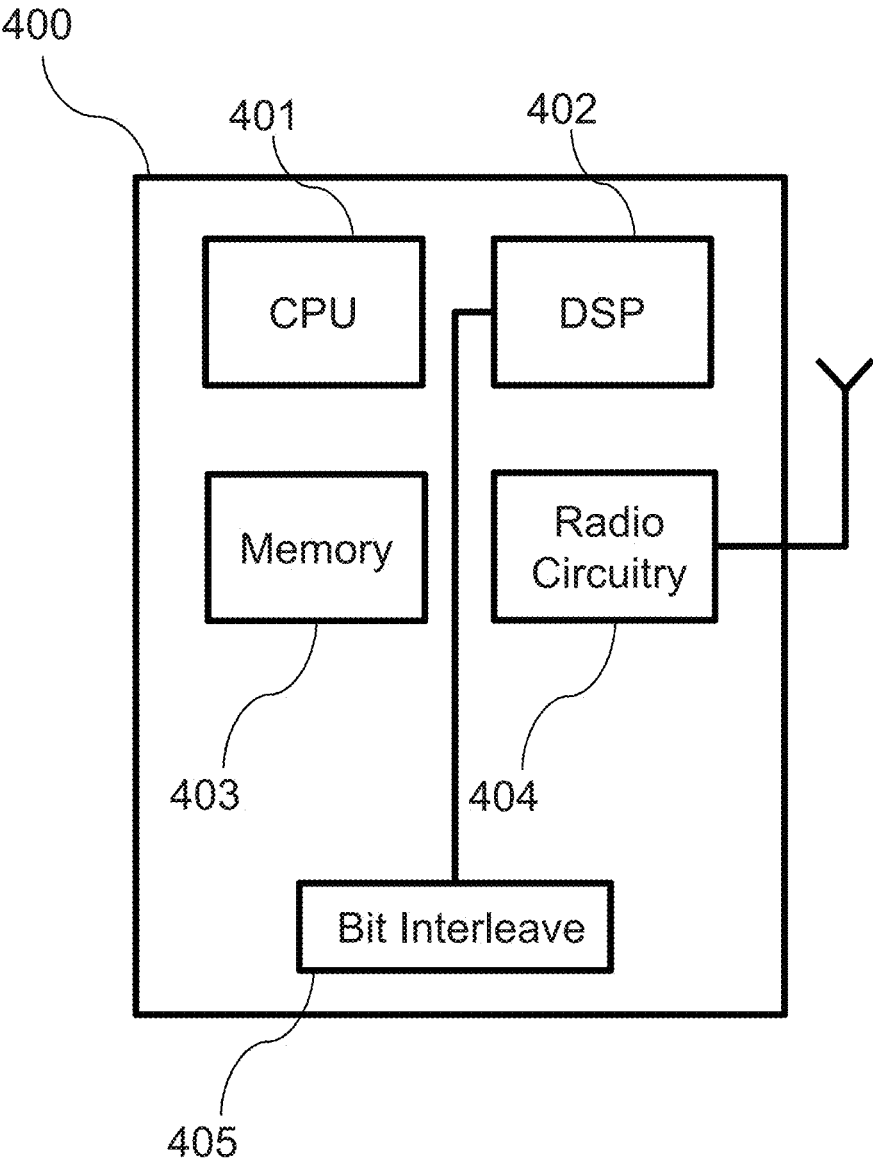
FIG. 4 is a schematic diagram of a further radio device, embodying the invention, comprising a custom hardware extension to a DSP.

FIG. 4 shows a variant radio device 400, of similar design to that of FIG. 1, that again has a processing system comprising a CPU 401, DSP 402, and an electronic memory 403, as well as having radio circuitry 404. However its processing system also has a hardware bit-interleave module 405, similar to that the bit-interleave module 304 of FIG. 3, but provided as a custom hardware extension to the DSP 402.

The radio device 400 implements the iterative polar transformation method using the DSP 402, with the working bit sequence and other intermediate results being stored in registers within the DSP 402 rather than in dedicated registers. The bitwise XOR operations are performed using SIMD (Single Instruction, Multiple Data) instructions in software on the DSP 402, with the interleave operation being performed using custom hardware extension calls to the bit-interleave module 405 from within the DSP 402.

A particularly efficient DSP-based polar transformation calculation may be possible by the DSP when the input sequence exactly occupies, or fits within, two SIMD vectors of the DSP 402. If the number of input bits is greater than the twice SIMD width, then one or more additional XOR operations may be required.

Another set of embodiments may perform both the XOR and bit-interleave operations using native instructions within a DSP of the radio device (i.e. using a programmable processing system), if the DSP natively supports a bit-interleave operation, as well as a bitwise XOR operation.

Further embodiments may perform some or all parts of the XOR operations and/or bit-interleave operations using software instructions executing on a general-purpose CPU.

It will be appreciated by those skilled in the art that the invention has been illustrated by describing one or more specific embodiments thereof, but is not limited to these embodiments; many variations and modifications are possible, within the scope of the accompanying claims.

The invention claimed is:

1. A radio apparatus comprising:
   radio transmitter circuitry; and
   a processing system,
wherein the processing system is configured to compute a polar transformation of an input sequence of $2^n$ bits and wherein the radio transmitter circuitry is configured to transmit the polar transformation of the input sequence by radio, and wherein the processing system comprises an electronic memory and is configured, when computing the polar transformation, to:
   store the input sequence of $2^n$ bits, optionally interleaved with an integer multiple of $2^n$ additional bits, as a working bit sequence in the electronic memory; and
   perform the following sequence of steps n times:
   i) compute a bitwise XOR of a contiguous first half of the working bit sequence with a contiguous second half of the working bit sequence, wherein the second half is disjoint from the first half;
   ii) store a result of the bitwise XOR in the electronic memory;
   iii) generate a bit-interleave sequence by interleaving the result of the bitwise XOR and the second half of the working bit sequence as alternate bits of the bit-interleave sequence; and
   iv) update the working bit sequence by storing the bit-interleave sequence in the electronic memory as an updated working bit sequence;
wherein, after performing the steps n times, the working bit sequence, or a contiguous subsequence thereof, is the polar transformation of the input sequence, for transmission by the radio transmitter circuitry.

2. The radio apparatus of claim 1, wherein the processing system is configured to store the input sequence interleaved with an integer multiple of $2^n$ additional bits, as the working bit sequence in the electronic memory.

3. The radio apparatus of claim 1, wherein the processing system further comprises a first register, and is configured to use the first register to store the working bit sequence, and additionally to use the first register to store each updated working bit sequence.

4. The radio apparatus of claim 3, wherein the processing system further comprises a second register, and is configured to use the second register to store the results of each of the bitwise XORs.

5. The radio apparatus of claim 1, wherein the processing system is further configured to store the input sequence as a contiguous subsequence of the working bit sequence, with each of an integer multiple of $2^n$ additional bits additionally stored contiguously in the working bit sequence, and is configured to apply an initial interleaving process to the working bit sequence, before the sequence of steps is performed n times.

6. The radio apparatus of claim 1, wherein the processing system is configured to store the input sequence interleaved with one or more further input sequences of $2^n$ bits in the working bit sequence, before the sequence of steps is performed n times, and the processing system is configured to compute the respective polar transformations of each of the input sequences in parallel.

7. The radio apparatus of claim 1, wherein the working bit sequence is exactly the input sequence of $2^n$ bits.

8. The radio apparatus of claim 1, wherein the processing system comprises a hardware bit-interleave module comprising circuitry configured to perform the generating of each of the bit-interleave sequences.

9. The radio apparatus of claim 8, wherein the processing system is further configured to use the hardware bit-interleave module to interleave the input sequence with an integer multiple of $2^n$ additional bits, and to store a resulting interleaved sequence in the electronic memory, as a working bit sequence, before the sequence of steps is performed n times.

10. The radio apparatus of claim 1, wherein the processing system comprises a circuit portion configured to perform the computing of each of the bitwise XORs.

11. The radio apparatus of claim 10, wherein the circuit portion is an XOR module comprising one or more binary XOR gates.

12. The radio apparatus of claim 1, wherein the processing system comprises a digital signal processor (DSP) and a memory storing instructions that, when executed by the DSP, cause the DSP to perform the computing of each of the bitwise XORs.

13. The radio apparatus of claim 12, wherein the processing system is configured to store the working bit sequence in one or more registers of the DSP.

14. The radio apparatus of claim 12, wherein the processing system is configured to perform the generating of each of the bit-interleave sequences using hardware circuitry that is provided as a custom hardware extension to the DSP.

15. The radio apparatus of claim 12, wherein the processing system is configured to perform the computing of each of the bitwise XORs using one or more native Single-Instruction, Multiple-Data (SIMD) instructions of the DSP, and to perform the generating of each of the bit-interleave sequences using one or more native Single-Instruction, Multiple-Data (SIMD) instructions of the DSP.

16. The radio apparatus of claim 1, wherein the processing system comprises a scalar or superscalar processor and a memory storing instructions that, when executed by the processor, cause the processor to perform the computing of the polar transformation of the input sequence of $2^n$ bits.

17. The radio apparatus of claim 1, wherein the radio transmitter circuitry is configured to transmit the polar transformation of the input sequence in a 5G New Radio transmission.

18. A method of operating a radio apparatus, the method comprising:
computing a polar transformation of an input sequence of $2^n$ bits; and
transmitting the polar transformation of the input sequence in a radio transmission,
wherein computing the polar transformation of the input sequence comprises:
storing the input sequence of $2^n$ bits, optionally interleaved with an integer multiple of $2^n$ additional bits, as a working bit sequence in an electronic memory of the radio apparatus; and
performing the following sequence of steps n times:
i) computing a bitwise XOR of a contiguous first half of the working bit sequence with a contiguous second half of the working bit sequence, wherein the second half is disjoint from the first half;
ii) storing a result of the bitwise XOR in the electronic memory;
iii) generating a bit-interleave sequence by interleaving the result of the bitwise XOR and the second half of the working bit sequence as alternate bits of the bit-interleave sequence; and
iv) updating the working bit sequence by storing the bit-interleave sequence in the electronic memory as the working bit sequence;
wherein, after performing the steps n times, the working bit sequence, or a contiguous subsequence thereof, is the polar transformation of the input sequence, for transmission by radio.

19. The method of claim 18, wherein the input sequence is stored interleaved with an integer multiple of $2^n$ additional bits, as the working bit sequence in the electronic memory.

20. The method of claim 18, wherein the radio transmission is a 5G New Radio transmission.

* * * * *